US012811599B2

(12) United States Patent
Lin et al.

(10) Patent No.: US 12,811,599 B2
(45) Date of Patent: Nov. 24, 2026

(54) ANALOG-TO-DIGITAL CONVERTING DEVICE AND ANALOG-TO-DIGITAL CONVERTING METHOD

(71) Applicant: REALTEK SEMICONDUCTOR CORPORATION, Hsinchu (TW)

(72) Inventors: Kai-Yue Lin, Hsinchu (TW); Wei-Jyun Wang, Hsinchu (TW); Kai Wang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 97 days.

(21) Appl. No.: 19/092,371

(22) Filed: Mar. 27, 2025

(65) Prior Publication Data

US 2025/0309912 A1 Oct. 2, 2025

(30) Foreign Application Priority Data

Apr. 2, 2024 (TW) ................................ 113112615

(51) Int. Cl.
*H03M 1/46* (2006.01)
*H03M 1/06* (2006.01)
*H03M 1/12* (2006.01)

(52) U.S. Cl.
CPC ........... *H03M 1/462* (2013.01); *H03M 1/466* (2013.01); *H03M 1/06* (2013.01); *H03M 1/12* (2013.01)

(58) Field of Classification Search
CPC ........ H03M 1/462; H03M 1/466; H03M 1/06; H03M 1/12
See application file for complete search history.

(56) References Cited

U.S. PATENT DOCUMENTS

2010/0066577 A1* 3/2010 Huang ................ H03M 1/0663 341/143
2022/0376698 A1 11/2022 Cho

OTHER PUBLICATIONS

OA letter of a counterpart TW application (appl. No. 113112615) mailed on Dec. 18, 2024.

* cited by examiner

*Primary Examiner* — Joseph J Lauture
(74) *Attorney, Agent, or Firm* — WPAT, PC

(57) ABSTRACT

An analog-to-digital converting device includes a capacitive digital-to-analog converter, a comparator, and a controller. The capacitive digital-to-analog converter respectively generates a first and a second sample voltage according to a non-inverting output voltage and an inverting output voltage of a programmable gain amplifier during a sample period. The comparator generates a comparing signal by comparing the first and the second sample voltages during a converting period. The controller controls the capacitive digital-to-analog converter to generate a converting voltage according to the comparing signal during the converting period. The controller controls the capacitive digital-to-analog converter such that the capacitive digital-to-analog converter is pre-charged to a pre-charge voltage during a pre-charge period. The pre-charge voltage is between a maximum value and a minimum value of the non-inverting output voltage and the inverting output voltage of the programmable gain amplifier.

20 Claims, 9 Drawing Sheets

ANALOG-TO-DIGITAL CONVERTING DEVICE AND ANALOG-TO-DIGITAL CONVERTING METHOD

BACKGROUND OF THE INVENTION

1. Field of the Invention

The present disclosure relates to an analog-to-digital converting device and an analog-to-digital converting method, especially to an analog-to-digital converting device and an analog-to-digital converting method that pre-charge a voltage to a suitable voltage level.

2. Description of Related Art

In the analog front end (AFE) system, the programmable gain amplifier (PGA) and the analog-to-digital converter (ADC) are responsible for receiving and processing signals. The programmable gain amplifier amplifies or reduces the signal and passes the signal to the analog-to-digital converter. The analog-to-digital converter then samples and quantizes the output signal of the programmable gain amplifier.

When the analog-to-digital converter samples the output signal of the programmable gain amplifier, the analog-to-digital converter needs to draw current of the programmable gain amplifier. The amount of drawn current will increase when the resolution of the analog-to-digital converter increases. If the analog-to-digital converter draws too much current of the programmable gain amplifier, it will affect the output signal of the programmable gain amplifier, such that the analog-to-digital converter samples distorted output signals, and the signal-to-noise ratio (SNR) is reduced.

SUMMARY OF THE INVENTION

In some aspects, an object of the present disclosure is to, but not limited to, provides an analog-to-digital converting device and an analog-to-digital converting method that makes an improvement to the prior art.

An embodiment of an analog-to-digital converting device of the present disclosure includes a capacitive digital-to-analog converter, a comparator, and a controller. The capacitive digital-to-analog converter is configured to respectively generate a first sample voltage and a second sample voltage according to a non-inverting output voltage and an inverting output voltage of a programmable gain amplifier during a sample period. The comparator is configured to generate a comparing signal by comparing the first sample voltage and the second sample voltage during a converting period. The controller is configured to control the capacitive digital-to-analog converter to generate a converting voltage according to the comparing signal during the converting period. The controller controls the capacitive digital-to-analog converter such that the capacitive digital-to-analog converter is pre-charged to a pre-charge voltage during a pre-charge period, wherein the pre-charge voltage is between the non-inverting output voltage and the inverting output voltage of the programmable gain amplifier.

An embodiment of an analog-to-digital converting method of the present disclosure includes following steps: generating a first sample voltage and a second sample voltage according to a non-inverting output voltage and an inverting output voltage of a programmable gain amplifier during a sample period by a capacitive digital-to-analog converter; generating a comparing signal by comparing the first sample voltage and the second sample voltage during a converting period by a comparator; controlling the capacitive digital-to-analog converter to generate a converting voltage according to the comparing signal during the converting period by a controller; and controlling the capacitive digital-to-analog converter such that the capacitive digital-to-analog converter is pre-charged to a pre-charge voltage during a pre-charge period by the controller, wherein the pre-charge voltage is between the non-inverting output voltage and the inverting output voltage of the programmable gain amplifier.

Technical features of some embodiments of the present disclosure make an improvement to the prior art. The analog-to-digital converting device and the analog-to-digital converting device method of the present disclosure can pre-charge the voltage of the analog-to-digital converting device to the pre-charge voltage during the pre-charge period. Compared to the prior art, the pre-charge voltage is near the output voltage of the programmable gain amplifier in the next operational cycle in possibility. In other words, since the difference between the pre-charge voltage and the output voltage of the programmable gain amplifier is smaller, the present disclosure can control the analog-to-digital converting device to reduce drawing peak current from the programmable gain amplifier. Therefore, the impact to the output voltage of the programmable gain amplifier is reduced, thereby avoiding the analog-to-digital converting device to sample distorted output signals, and consequently improving the signal-to-noise ratio.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

Figure 1:
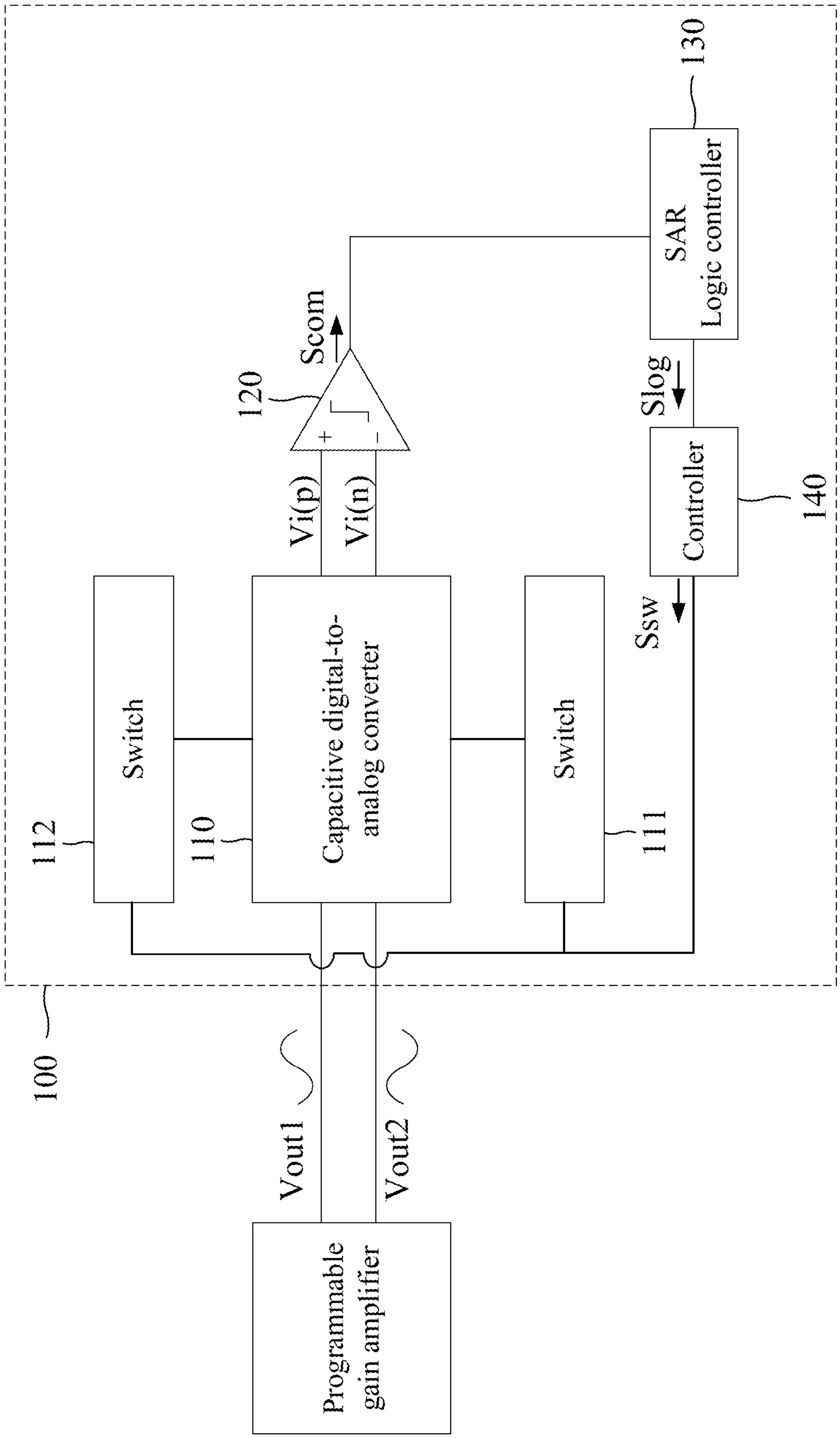
FIG. 1 shows an embodiment of an analog-to-digital converting device of the present disclosure.
Figure 2:
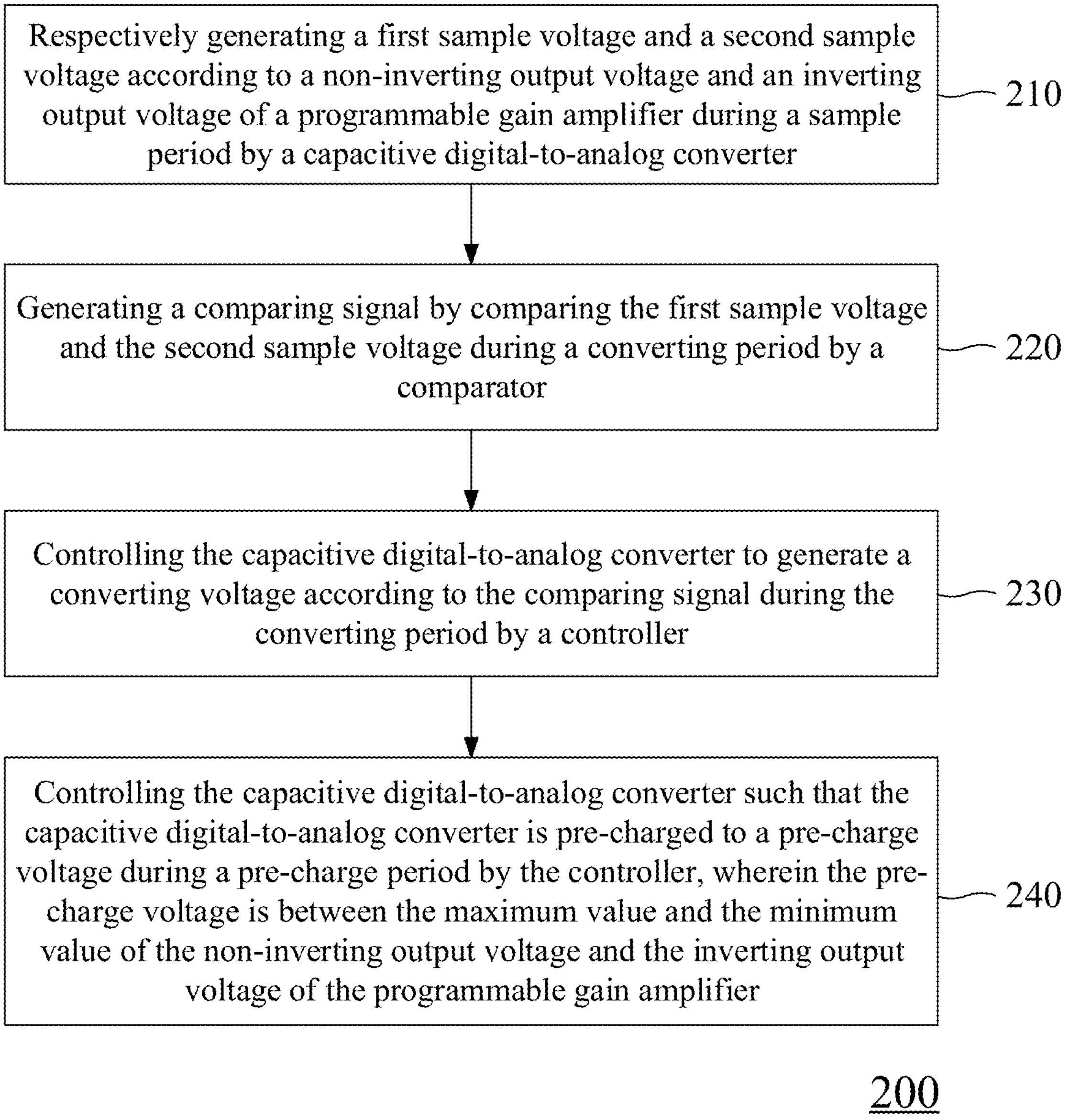
FIG. 2 shows an embodiment of a flow diagram of an analog-to-digital converting method of the present disclosure.

FIG. 1 shows an embodiment of an analog-to-digital converting device 100 of the present disclosure. As shown in the figure, the analog-to-digital converting device 100 includes a capacitive digital-to-analog converter 110, a comparator 120, a successive approximation logic controller 130, and a controller 140. For facilitating the understanding of the operations of the analog-to-digital converting device 100, reference is made to FIG. 2. FIG. 2 shows an embodiment of a flow diagram of an analog-to-digital converting method 200 of the present disclosure.

Reference is made to FIG. 1 an FIG. 2. In step 210, respectively generating a first sample voltage and a second sample voltage according to a non-inverting output voltage and an inverting output voltage of a programmable gain amplifier during a sample period by a capacitive digital-to-analog converter 110. For example, referring to FIG. 3, the capacitive digital-to-analog converter 110 generates a non-inverting sample voltage Vi(p) according to the non-inverting output voltage Vout1 of the programmable gain amplifier, and generates an inverting sample voltage Vi(n) according to the inverting output voltage Vout2 of the programmable gain amplifier during the sample period Psam1. In some embodiments, if the programmable gain amplifier operates in single terminal, the capacitive digital-to-analog converter 110 can generate a non-inverting sample voltage according to the non-inverting output voltage of the programmable gain amplifier, and generate an inverting sample voltage according to another reference voltage.

In some embodiments, the capacitive digital-to-analog converter 110 can be a capacitor digital to analog converter (CDAC).

Figure 3:
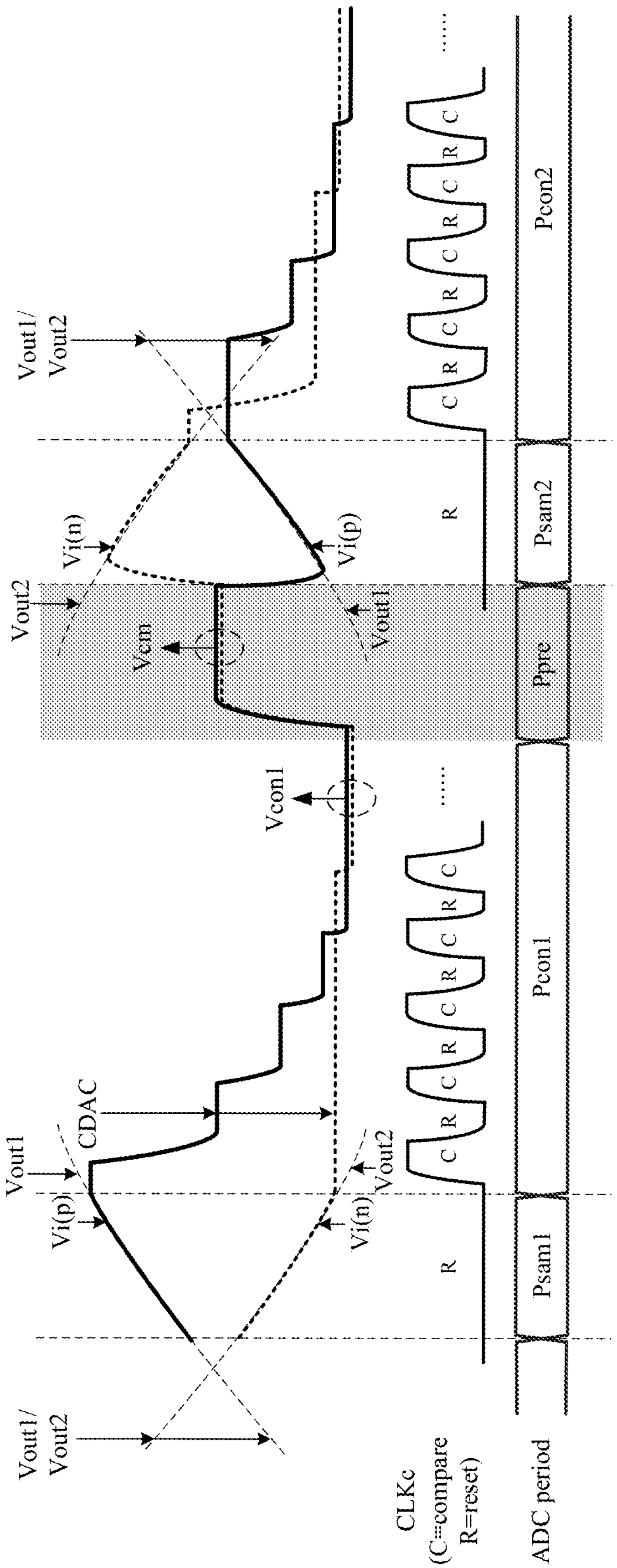
FIG. 3 shows an embodiment of a signal timing diagram of an analog-to-digital converting device of the present disclosure.

In step 220, referring to FIG. 1 to FIG. 3, generating a comparing signal Scom by comparing the first sample voltage Vi(p) and the second sample voltage Vi(n) during a converting period Pcon1 by the comparator 120.

In step 230, referring to FIG. 1 to FIG. 3, controlling the capacitive digital-to-analog converter 110 to generate a converting voltage Vcon according to the comparing signal Scom during the converting period Pcon1 by the controller 140.

In some embodiments, referring to FIG. 1 to FIG. 3, the successive approximation logic controller 130 is configured to receive the comparing signal Scom, and output a logic signal Slog to the controller 140 during the converting period Pcon1, such that the controller 140 controls switches 111, 112 and the capacitive digital-to-analog converter 110 to generate the converting voltage Vcon1. In some embodiments, the successive approximation logic controller 130 can utilize a binary search manner to control the switches 111, 112 and the capacitive digital-to-analog converter 110 through the controller 140 to generate a corresponding voltage. In some embodiments, the successive approximation logic controller 130 can be a successive approximation register (SAR) logic controller.

In step 240, referring to FIG. 1 to FIG. 3, controlling the capacitive digital-to-analog converter 110 such that the capacitive digital-to-analog converter 110 is pre-charged to a pre-charge voltage Vcm during a pre-charge period Ppre by the controller 140. As shown in FIG. 3, the pre-charge voltage Vcm is between the maximum value and the minimum value of the non-inverting output voltage Vout1 and the inverting output voltage Vout2 of the programmable gain amplifier.

In view of the above, the pre-charge voltage Vcm is between the maximum value and the minimum value of the non-inverting output voltage Vout1 and the inverting output voltage Vout2 of the programmable gain amplifier. During a resample period Psam2, compared to the prior art, the pre-charge voltage Vem is near the output voltages Vout1, Vout2 of the programmable gain amplifier in the next operational cycle in possibility. In other words, since the expected value of the difference between the pre-charge voltage Vcm and the output voltages Vout1, Vout2 of the programmable gain amplifier is smaller, the present disclosure can control the analog-to-digital converting device 100 to reduce drawing peak current from the programmable gain amplifier. Therefore, the impact to the output voltages Vout1, Vout2 of the programmable gain amplifier is reduced, thereby avoiding the analog-to-digital converting device 100 to sample distorted output signals, and consequently improving the signal-to-noise ratio.

In some embodiments, referring to FIG. 1 to FIG. 3, the capacitive digital-to-analog converter 110 generates resample voltages Vi(p), Vi(n) according to the pre-charge voltage Vcm and the output voltages Vout1, Vout2 of the programmable gain amplifier during the resample period Psam2. As shown in FIG. 3, compared to the prior art, the pre-charge voltage Vcm is near the output voltages Vout1, Vout2 of the programmable gain amplifier in the next operational cycle in probability. In other words, since the expected value of the difference between the pre-charge voltage Vem and the output voltages Vout1, Vout2 of the programmable gain amplifier is smaller, the present disclosure can control the analog-to-digital converting device 100 to reduce drawing peak current from the programmable gain amplifier.

In some embodiments, referring to FIG. 1 to FIG. 3, the pre-charge period Ppre is before the resample period Psam2. Therefore, the present disclosure can pre-charge the capacitive digital-to-analog converter 110 to the pre-charge voltage Vcm during the pre-charge period Ppre. Compared to the prior art, the pre-charge voltage Vem is near the output voltages Vout1, Vout2 of the programmable gain amplifier in the next operational cycle in probability. In other words, since the expected value of the difference between the pre-charge voltage Vcm and the output voltages Vout1, Vout2 of the programmable gain amplifier is smaller, peak current of the programmable gain amplifier drawn by the capacitive digital-to-analog converter 110 is reduced when the resample period Psam2 starts.

In some embodiments, referring to FIG. 3, a timing sequence of the analog-to-digital converting device 100 is the sample period Psam1, the converting period Pcon1, and the pre-charge period Ppre. Specifically, the timing sequence of the analog-to-digital converting device 100 is the sample period Psam1, the converting period Pcon1, the pre-charge period Ppre, the resample period Psam2, and the re-converting period Pcon2.

Figure 4:
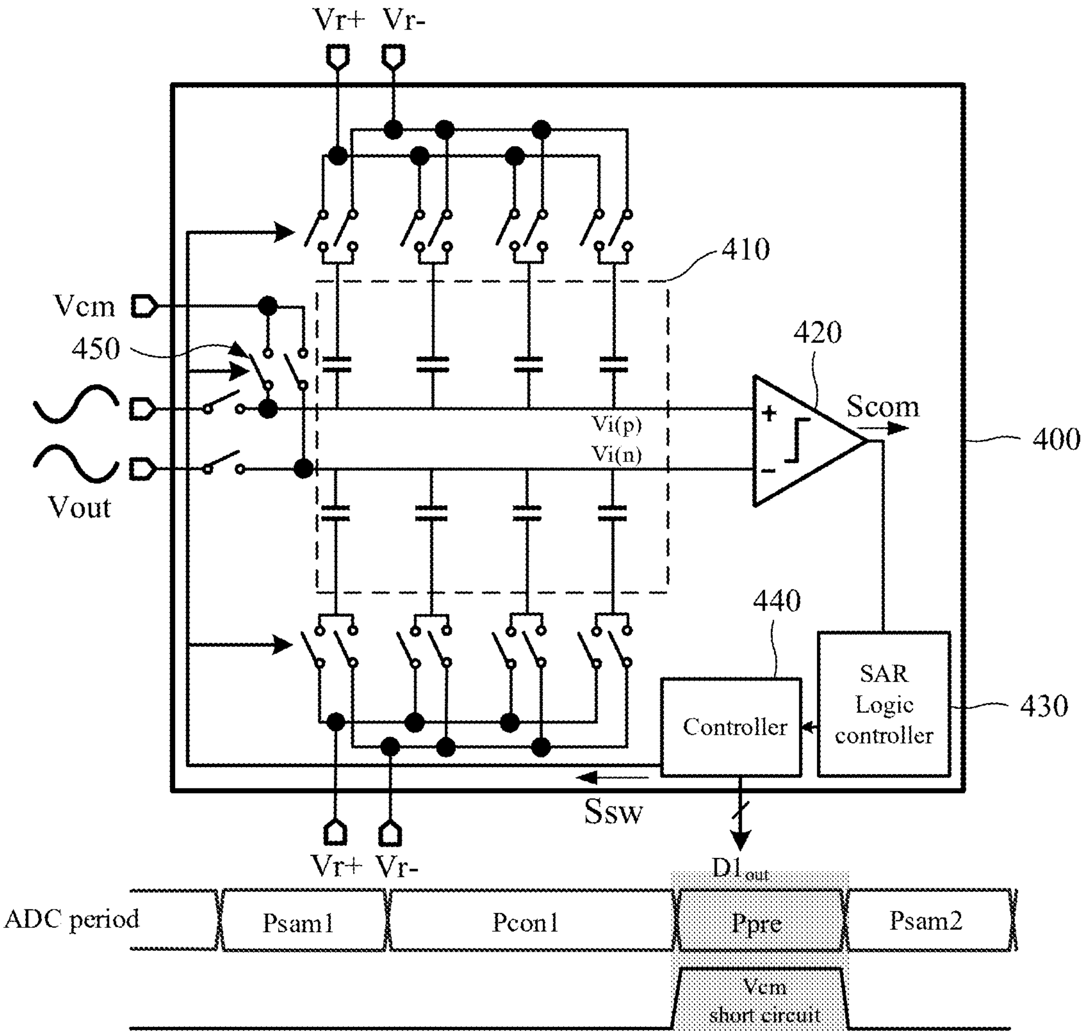
FIG. 4 shows an embodiment of an analog-to-digital converting device of the present disclosure.

FIG. 4 shows an embodiment of an analog-to-digital converting device 400 of the present disclosure. Compared to the circuit block of the analog-to-digital converting device 100 in FIG. 1, FIG. 4 illustrates a detailed circuit of the analog-to-digital converting device 400.

As shown in FIG. 4, the analog-to-digital converting device 400 further includes a switch 450. Referring to FIG. 3 and FIG. 4, the switch 450 is configured to receive the pre-charge voltage Vcm, and provide the pre-charge voltage Vcm to the capacitive digital-to-analog converter 410 according to a switching signal Ssw of the controller 440 during the pre-charge period Ppre for pre-charging the capacitive digital-to-analog converter 410 to the pre-charge voltage Vcm. As shown in FIG. 3, compared to the prior art, the pre-charge voltage Vem is near the output voltages Vout1, Vout2 of the programmable gain amplifier in the next operational cycle in probability. In other words, the pre-charge voltage Vem is near the output voltages Vout1, Vout2, the present disclosure can control the analog-to-digital converting device 400 to reduce drawing peak current from the programmable gain amplifier.

Figure 5:
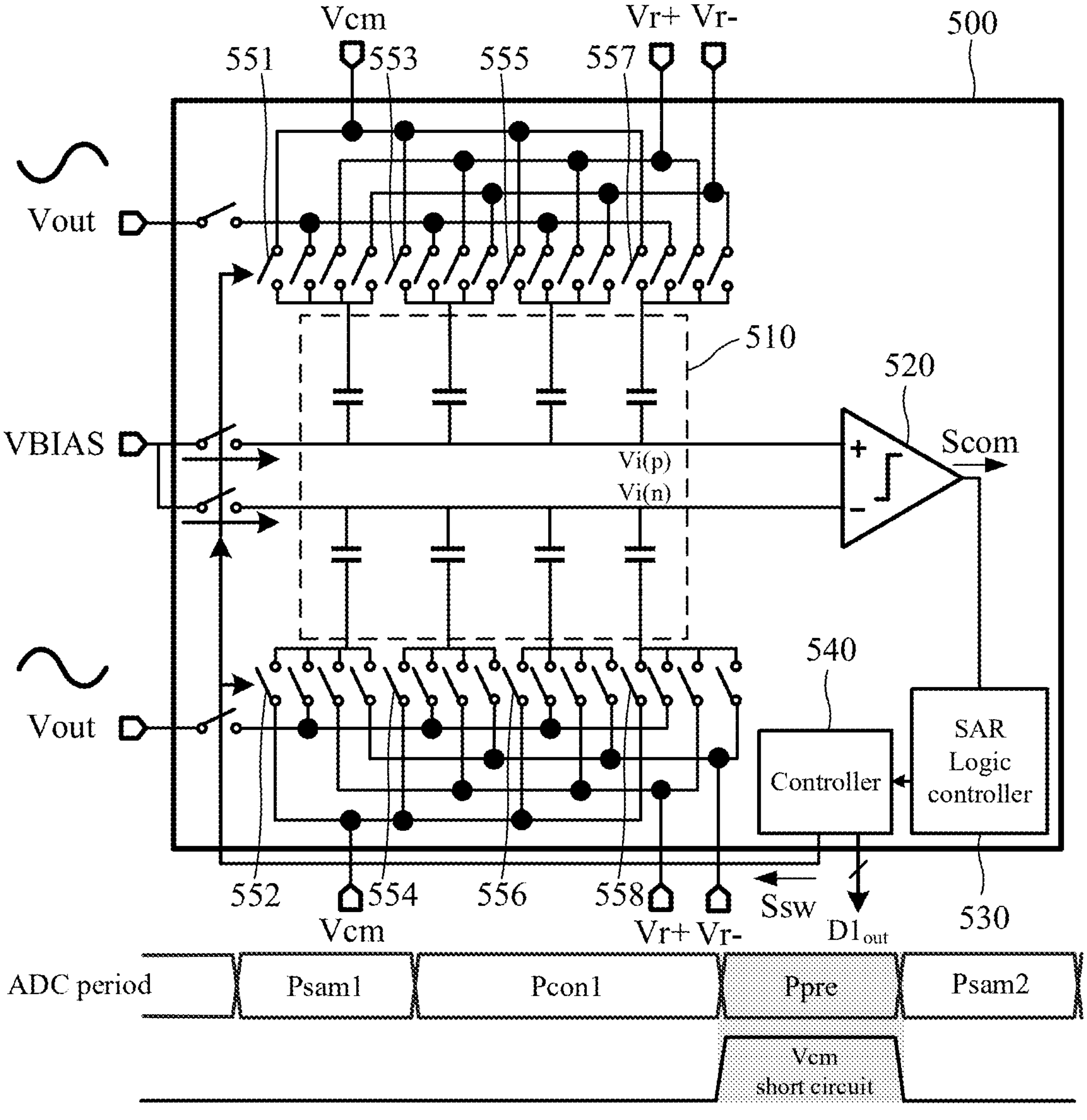
FIG. 5 shows an embodiment of an analog-to-digital converting device of the present disclosure.

FIG. 5 shows an embodiment of an analog-to-digital converting device 500 of the present disclosure. Compared to the circuit block of the analog-to-digital converting device 100 in FIG. 1, FIG. 5 illustrates a detailed circuit of the analog-to-digital converting device 500.

As shown in FIG. 5, the analog-to-digital converting device 500 further includes switches 551~558. Referring to FIG. 3 and FIG. 5, the switches 551~558 are configured to receive the pre-charge voltage Vcm, and provide the pre-charge voltage Vcm to the capacitive digital-to-analog converter 510 according to a switching signal Ssw of the controller 540 during the pre-charge period Ppre for pre-charging the capacitive digital-to-analog converter 510 to the pre-charge voltage Vcm. As shown in FIG. 3, compared to the prior art, the pre-charge voltage Vem is near the output voltages Vout1, Vout2 of the programmable gain amplifier in the next operational cycle in probability. In other words, the pre-charge voltage Vem is near the output voltages Vout1, Vout2, the present disclosure can control the analog-to-digital converting device 500 to reduce drawing peak current from the programmable gain amplifier.

In some embodiments, the pre-charge voltage Vcm can be provided by the programmable gain amplifier. However, the present disclosure is not limited to the above-mentioned embodiment. In another embodiment, the pre-charge voltage Vcm can be provided by other suitable electronic element based on actual requirements.

Figure 6:
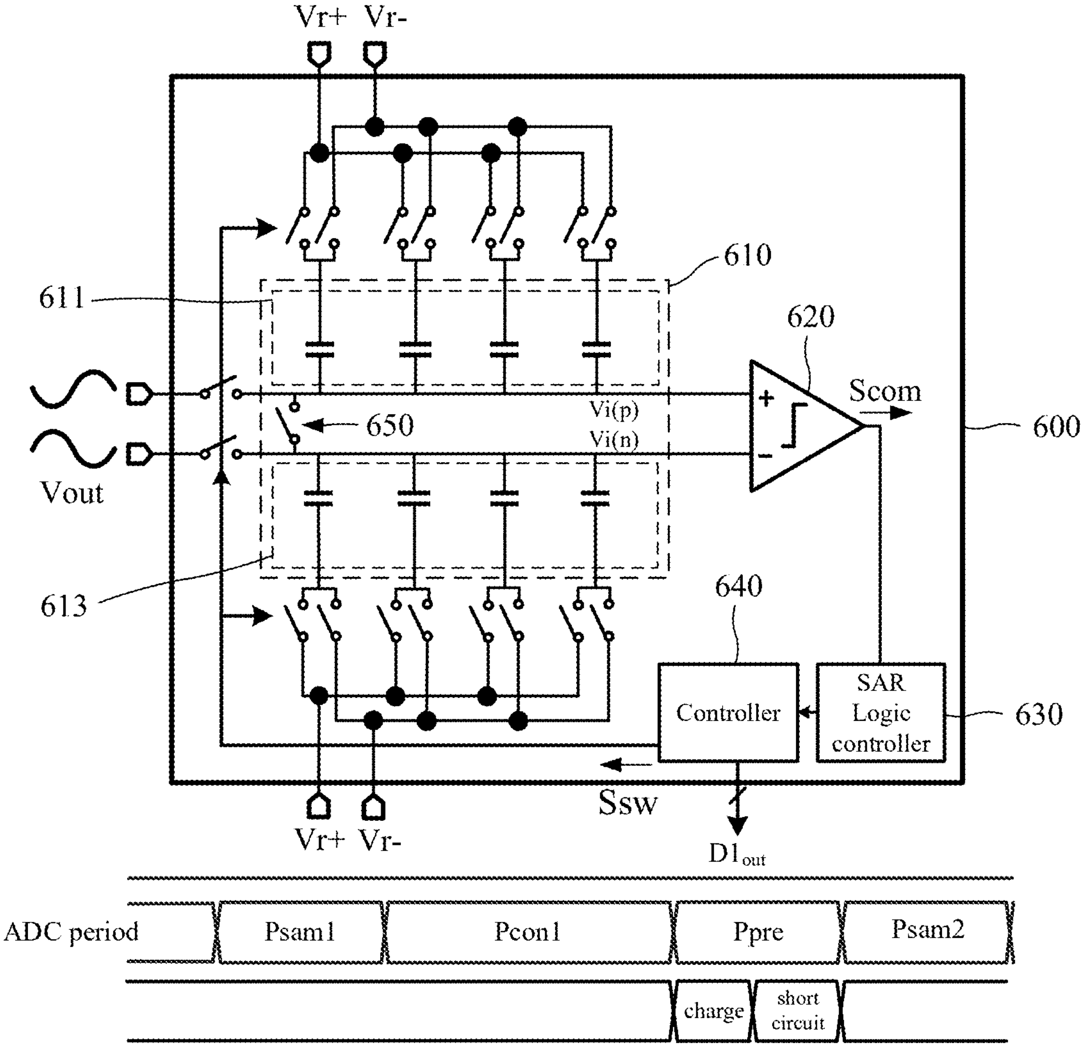
FIG. 6 shows an embodiment of an analog-to-digital converting device of the present disclosure.

FIG. 6 shows an embodiment of an analog-to-digital converting device 600 of the present disclosure. Compared to the circuit block of the analog-to-digital converting device 100 in FIG. 1, FIG. 6 illustrates a detailed circuit of the analog-to-digital converting device 600.

Figure 7:
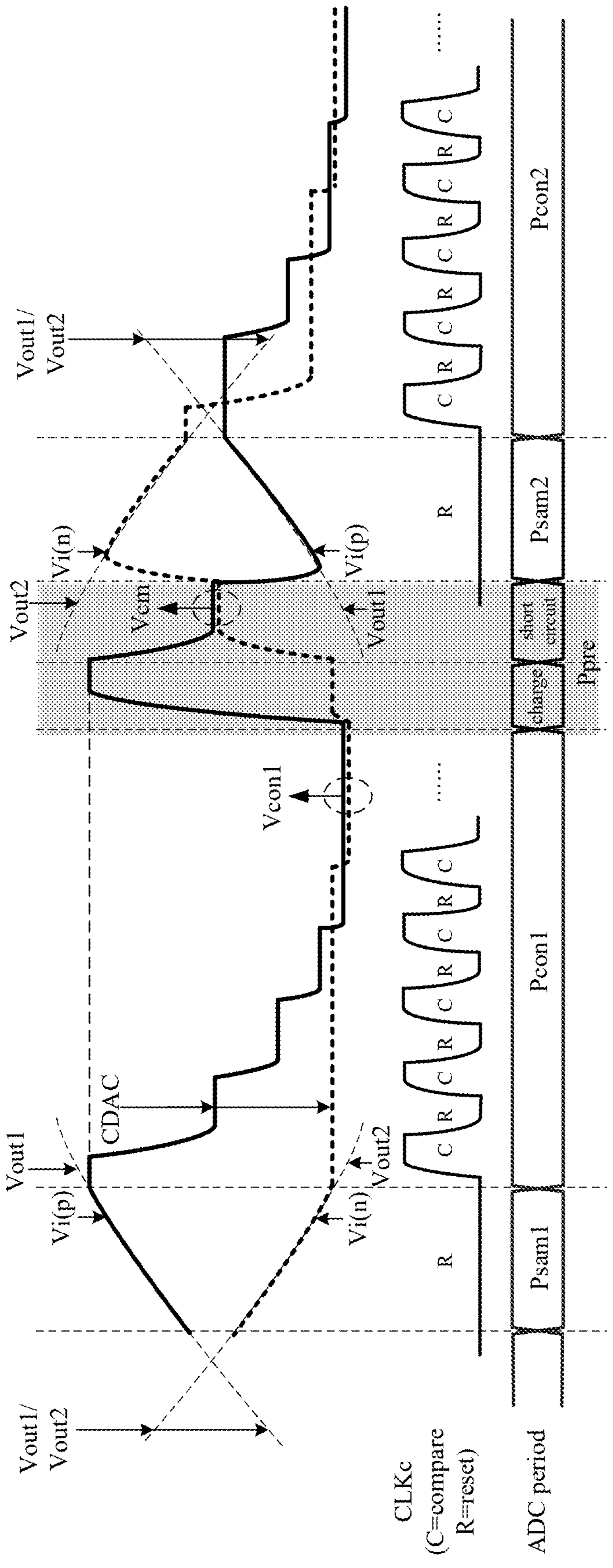
FIG. 7 shows an embodiment of a signal timing diagram of an analog-to-digital converting device of the present disclosure.

As shown in FIG. 6, the capacitive digital-to-analog converter 610 includes a first capacitive portion 611 and a second capacitive portion 613. The first capacitive portion 611 is coupled to a first terminal (e.g., a non-inverting input terminal) of the comparator 620, and the second capacitive portion 613 is coupled to a second terminal (e.g., an inverting input terminal) of the comparator 620. Referring to FIG. 7, the controller 640 controls the first capacitive portion 611 to charge to near the non-inverting sample voltage Vi(p), and controls the second capacitive portion 613 to charge to near the inverting sample voltage Vi(n) during a charging period of the pre-charge period Ppre. Subsequently, the controller 640 controls the first capacitive portion 611 to couple to the second capacitive portion 613 during a short circuit period of the pre-charge period Ppre, such that the first capacitive portion 611 and the second capacitive portion 613 are both balanced to the pre-charge voltage Vcm.

In some embodiments, the analog-to-digital converting device 600 further includes a switch 650. The switch 650 is coupled between the first capacitive portion 611 and the second capacitive portion 613, and couple the first capacitive portion 611 and the second capacitive portion 613 according to a switching voltage Ssw of the controller 640 during the short circuit period of the pre-charge period Pre, such that the first capacitive portion 611 and the second capacitive portion 613 are both balanced to the pre-charge voltage Vcm. As shown in FIG. 7, compared to the prior art, the pre-charge voltage Vem is near the output voltages Vout1, Vout2 of the programmable gain amplifier in the next operational cycle in probability. In other words, the pre-charge voltage Vem is near the output voltages Vout1, Vout2, the present disclosure can control the analog-to-digital converting device 600 to reduce drawing peak current from the programmable gain amplifier.

Besides, compared to the analog-to-digital converting devices 400, 500 in FIG. 4 and FIG. 5, the analog-to-digital converting device 600 in FIG. 6 does not need to obtain the pre-charge voltage Vcm from external circuits, and generates equivalent pre-charge voltage Vcm by shorting the first capacitive portion 611 and the second capacitive portion 613, thereby further reducing the complexity of the circuit layout.

In some embodiments, the analog-to-digital converting devices 400, 600 in FIG. 4 and FIG. 6 can be a top plate sample analog-to-digital converter (ADC). In some embodiments, the analog-to-digital converting device 500 in FIG. 5 can be a bottom plate sample analog-to-digital converter (ADC).

Figure 8:
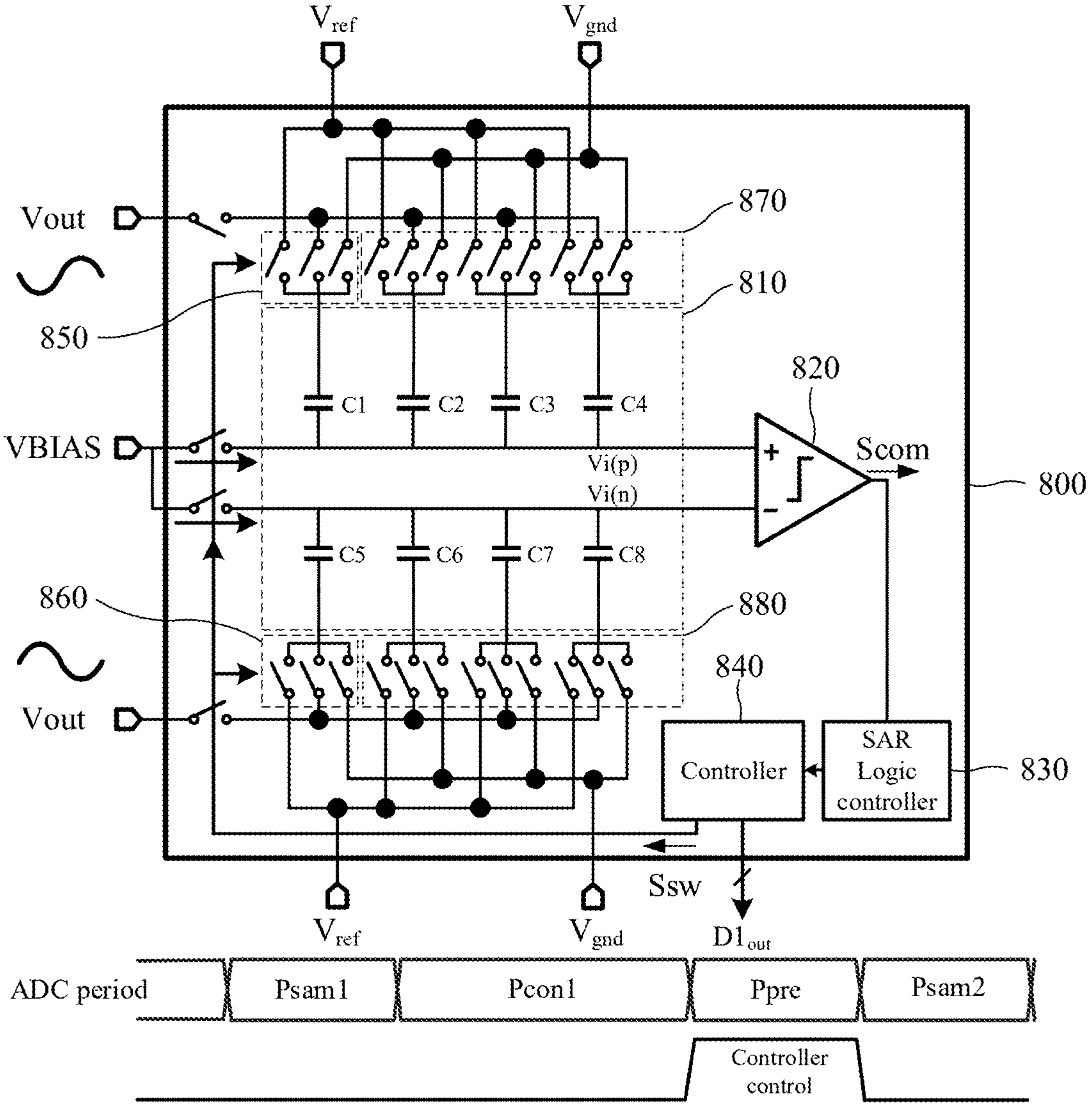
FIG. 8 shows an embodiment of an analog-to-digital converting device of the present disclosure.

FIG. 8 shows an embodiment of an analog-to-digital converting device 800 of the present disclosure. Compared to the circuit block of the analog-to-digital converting device 100 in FIG. 1, FIG. 8 illustrates a detailed circuit of the analog-to-digital converting device 800.

As shown in FIG. 8, the capacitive digital-to-analog converter 810 includes a plurality of capacitors C1~C8. The capacitors C1~C8 are coupled to the comparator 820. The controller 840 controls a first part capacitor (e.g., capacitors C1, C5) of the capacitors C1~C8 to charge to a high level voltage (e.g., voltage $V_{ref}$), and controls a second part capacitor (e.g., capacitors C2~C4 and C6~C8) of the capacitor C1~C8 to charge to a low level voltage (e.g., voltage $V_{gnd}$) during the pre-charge period Ppre. Both of the first part capacitor (e.g., capacitors C1, C5) and the second part capacitor (e.g., capacitors C2~C4 and C6~C8) of the capacitors C1~C8 provide the pre-charge voltage Vcm to the capacitive digital-to-analog converter 810 according to the high level voltage (e.g., voltage $V_{ref}$) and the low level voltage (e.g., voltage $V_{gnd}$).

In some embodiments, the capacitors C1, C5 of the first part capacitor are set to be 1 C. Besides, the capacitor C2 and the capacitor C6 of the second part capacitor are set to be 0.5 C, and the capacitors C3, C4 and the capacitors C7, C8 of the second part capacitor are set to be 0.25 C. However, the present disclosure is not limited to the above-mentioned embodiment. In another embodiment, the capacitances of the first part capacitor and the second part capacitor can be set to other suitable capacitances based on actual requirements.

Figure 9:
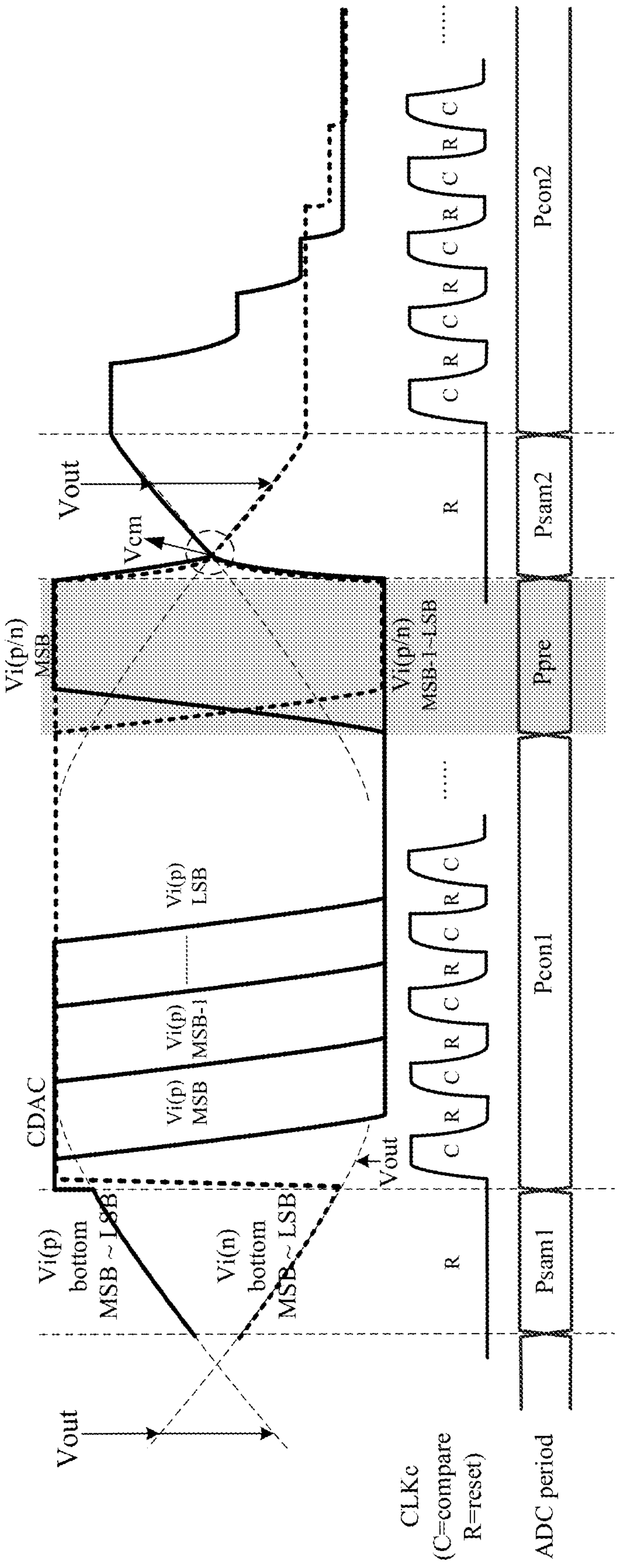
FIG. 9 shows an embodiment of a signal timing diagram of an analog-to-digital converting device of the present disclosure.

In some embodiments, the analog-to-digital converting device 800 further includes first switches 850, 860 and second switches 870, 880. The first switches 850, 860 charge the first part capacitor (e.g., capacitor C1, C5) to a high level voltage (e.g., voltage $V_{ref}$) according to the switching signal Ssw of the controller 840 during the pre-charge period Pre. The second switch 870, 880 charge the second part capacitor (e.g., capacitors C2~C4 and C6~C8) to a low level voltage (e.g., voltage $V_{gnd}$) according to the switching signal Ssw of the controller 840 during the pre-charge period Pre. Subsequently, both of the first part capacitor (e.g., capacitors C1, C5) and the second part capacitor (e.g., capacitors C2~C4 and C6~C8) of the capacitors C1~C8 provide equivalent pre-charge voltage Vcm to the capacitive digital-to-analog converter 810 according to the high level voltage (e.g., voltage $V_{ref}$) and the low level voltage (e.g., voltage $V_{gnd}$). As shown in FIG. 9, the pre-charge voltage Vem is near the output voltage Vout, the present disclosure can control the analog-to-digital converting device 800 to reduce drawing peak current from the programmable gain amplifier.

In some embodiments, the analog-to-digital converting device 800 in FIG. 8 can be a bottom plate sample analog-to-digital converter (ADC). Compared to the analog-to-digital converting devices 400, 500, 600 in FIG. 4, FIG. 5, and FIG. 6, the analog-to-digital converting device 800 in FIG. 8 only needs to control the existing switches of the bottom plate sample ADC to provide the equivalent pre-charge voltage Vcm, and the analog-to-digital converting device 800 in FIG. 8 does not need additional switch, thereby further reducing the complexity of the circuit layout.

It is noted that the present disclosure is not limited to the embodiments as shown in FIG. 1 to FIG. 9, it is merely an example for illustrating one of the implements of the present disclosure, and the scope of the present disclosure shall be defined on the bases of the claims as shown below. In view of the foregoing, it is intended that the present disclosure covers modifications and variations to the embodiments of the present disclosure, and modifications and variations to the embodiments of the present disclosure also fall within the scope of the following claims and their equivalents.

As described above, technical features of some embodiments of the present disclosure make an improvement to the prior art. The analog-to-digital converting device and the analog-to-digital converting device method of the present disclosure can pre-charge the voltage of the analog-to-digital converting device to the pre-charge voltage during the pre-charge period. Compared to the prior art, the pre-charge voltage is near the output voltage of a programmable gain amplifier in the next operational cycle in probability. In other words, since the difference between the pre-charge voltage and the output voltage of the programmable gain amplifier is smaller, the present disclosure can control the analog-to-digital converting device to reduce drawing peak current from the programmable gain amplifier. Therefore, the impact to the output voltage of the programmable gain amplifier is reduced, thereby avoiding the analog-to-digital converting device to sample distorted output signals, and consequently improving the signal-to-noise ratio.

It is noted that people having ordinary skill in the art can selectively use some or all of the features of any embodiment in this specification or selectively use some or all of the features of multiple embodiments in this specification to implement the present invention as long as such implementation is practicable; in other words, the way to implement the present invention can be flexible based on the present disclosure.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An analog-to-digital converting device, comprising:

a capacitive digital-to-analog converter, configured to respectively generate a first sample voltage and a second sample voltage according to a non-inverting output voltage and an inverting output voltage of a programmable gain amplifier during a sample period;

a comparator, configured to generate a comparing signal by comparing the first sample voltage and the second sample voltage during a converting period; and a controller, configured to control the capacitive digital-to-analog converter to generate a converting voltage according to the comparing signal during the converting period;

wherein the controller controls the capacitive digital-to-analog converter such that the capacitive digital-to-analog converter is pre-charged to a pre-charge voltage during a pre-charge period, wherein the pre-charge voltage is between the non-inverting output voltage and the inverting output voltage of the programmable gain amplifier.

2. The analog-to-digital converting device of claim 1, wherein the capacitive digital-to-analog converter respectively generates a first resample voltage and a second resample voltage according to the pre-charge voltage and the non-inverting output voltage and the inverting output voltage of the programmable gain amplifier during a resample period.

3. The analog-to-digital converting device of claim 2, wherein the pre-charge period is before the resample period.

4. The analog-to-digital converting device of claim 1, further comprising:

at least one switch, configured to receive the pre-charge voltage, and provide the pre-charge voltage to the capacitive digital-to-analog converter according to a switching signal of the controller during the pre-charge period so as to pre-charge the capacitive digital-to-analog converter to the pre-charge voltage.

5. The analog-to-digital converting device of claim 1, wherein the capacitive digital-to-analog converter comprises:

a first capacitive portion, coupled to a first terminal of the comparator; and a second capacitive portion, coupled to a second terminal of the comparator;

wherein the controller controls the first capacitive portion to charge to near the first sample voltage, and controls the second capacitive portion to charge to near the second sample voltage during a charging period of the pre-charge period;

wherein the controller controls the first capacitive portion to couple to the second capacitive portion during a short circuit period of the pre-charge period, such that the first capacitive portion and the second capacitive portion are both balanced to the pre-charge voltage.

6. The analog-to-digital converting device of claim 5, further comprising:

a switch, coupled between the first capacitive portion and the second capacitive portion, and coupling the first capacitive portion and the second capacitive portion according to a switching voltage of the controller during the short circuit period of the pre-charge period, such that the first capacitive portion and the second capacitive portion are both balanced to the pre-charge voltage.

7. The analog-to-digital converting device of claim 1, wherein the capacitive digital-to-analog converter comprises:

a plurality of capacitors, coupled to the comparator, wherein the controller controls a first part capacitor of the capacitors to charge to a high level voltage, and controls a second part capacitor of the capacitors to charge to a low level voltage during the pre-charge period, wherein both of the first part capacitor and the second part capacitor of the capacitors provide the pre-charge voltage according to the high level voltage and the low level voltage.

8. The analog-to-digital converting device of claim 7, further comprising:

at least one first switch, charging the first part capacitor to the high level voltage according to a switching signal of the controller during the pre-charge period; and at least one second switch, charging the second part capacitor to the low level voltage according to the switching signal of the controller during the pre-charge period.

9. The analog-to-digital converting device of claim 1, further comprising:

a successive approximation logic controller, configured to receive the comparing signal, and output a logic signal to the controller during the converting period, such that the controller controls the capacitive digital-to-analog converter to generate the converting voltage.

10. The analog-to-digital converting device of claim 1, wherein a timing sequence of the analog-to-digital converting device is the sample period, the converting period, and the pre-charge period.

11. An analog-to-digital converting method, comprising:

generating a first sample voltage and a second sample voltage according to a non-inverting output voltage and an inverting output voltage of a programmable gain amplifier during a sample period by a capacitive digital-to-analog converter;

generating a comparing signal by comparing the first sample voltage and the second sample voltage during a converting period by a comparator;

controlling the capacitive digital-to-analog converter to generate a converting voltage according to the comparing signal during the converting period by a controller; and controlling the capacitive digital-to-analog converter such that the capacitive digital-to-analog converter is pre-charged to a pre-charge voltage during a pre-charge period by the controller, wherein the pre-charge voltage is between the non-inverting output voltage and the inverting output voltage of the programmable gain amplifier.

12. The analog-to-digital converting method of claim 11, further comprising:

respectively generating a first resample voltage and a second resample voltage according to the pre-charge voltage and the non-inverting output voltage and the inverting output voltage of the programmable gain amplifier during a resample period by the capacitive digital-to-analog converter.

13. The analog-to-digital converting method of claim 12, wherein the pre-charge period is before the resample period.

14. The analog-to-digital converting method of claim 11, further comprising:

receiving the pre-charge voltage, and providing the pre-charge voltage to the capacitive digital-to-analog converter according to a switching signal of the controller during the pre-charge period by at least one switch so as to pre-charge the capacitive digital-to-analog converter to the pre-charge voltage.

15. The analog-to-digital converting method of claim 11, further comprising:

controlling a first capacitive portion of the capacitive digital-to-analog converter to charge to near the first sample voltage, and controlling a second capacitive portion of the capacitive digital-to-analog converter to charge to near the second sample voltage during a charging period of the pre-charge period by the controller; and controlling the first capacitive portion to couple to the second capacitive portion during a short circuit period of the pre-charge period by the controller, such that the first capacitive portion and the second capacitive portion are both balanced to the pre-charge voltage.

16. The analog-to-digital converting method of claim 15, further comprising:

coupling the first capacitive portion and the second capacitive portion according to a switching voltage of the controller during the short circuit period of the pre-charge period by a switch, such that the first capacitive portion and the second capacitive portion are both balanced to the pre-charge voltage.

17. The analog-to-digital converting method of claim 11, further comprising:

controlling a first part capacitor of a plurality of capacitors of the capacitive digital-to-analog converter to charge to a high level voltage, and controlling a second part capacitor of the capacitors to charge to a low level voltage during the pre-charge period by the controller; and providing the pre-charge voltage according to the high level voltage and the low level voltage by both of the first part capacitor and the second part capacitor of the capacitors.

18. The analog-to-digital converting method of claim 17, further comprising:

charging the first part capacitor to the high level voltage according to a switching signal of the controller during the pre-charge period by at least one first switch; and charging the second part capacitor to the low level voltage according to the switching signal of the controller during the pre-charge period by at least one second switch.

19. The analog-to-digital converting method of claim 11, further comprising:

receiving the comparing signal, and outputting a logic signal to the controller during the converting period by a successive approximation logic controller, such that the controller controls the capacitive digital-to-analog converter to generate the converting voltage.

20. The analog-to-digital converting method of claim 11, wherein a timing sequence of the analog-to-digital converting device is the sample period, the converting period, and the pre-charge period.

* * * * *